(12) United States Patent
Chen

(10) Patent No.: US 11,079,641 B2
(45) Date of Patent: Aug. 3, 2021

(54) DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Zesheng Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/640,068

(22) PCT Filed: May 17, 2019

(86) PCT No.: PCT/CN2019/087337
§ 371 (c)(1),
(2) Date: Feb. 19, 2020

(87) PCT Pub. No.: WO2020/155469
PCT Pub. Date: Aug. 6, 2020

(65) Prior Publication Data
US 2021/0141278 A1      May 13, 2021

(30) Foreign Application Priority Data
Jan. 30, 2019 (CN) .......................... 201910093568.5

(51) Int. Cl.
*G02F 1/1362* (2006.01)
*H01L 27/12* (2006.01)

(52) U.S. Cl.
CPC .. *G02F 1/136286* (2013.01); *G02F 1/136277* (2013.01); *H01L 27/124* (2013.01)

(58) Field of Classification Search
None
See application file for complete search history.

(56) References Cited

U.S. PATENT DOCUMENTS

2016/0246399 A1* 8/2016 Huang ............... G09G 3/20
2017/0033123 A1* 2/2017 Lv ................. H01L 27/1259

FOREIGN PATENT DOCUMENTS

| CN | 104134429 | 11/2014 |
|---|---|---|
| CN | 106200162 | 12/2016 |
| CN | 106406611 | 2/2017 |
| CN | 107767772 | 3/2018 |
| CN | 109273365 | 1/2019 |
| JP | 08-286202 | 11/1996 |

* cited by examiner

*Primary Examiner* — James A Dudek

(57) ABSTRACT

A display panel and a manufacturing method thereof are provided. The display panel includes a substrate having a semiconductor film layer structure which is provided with an active area, a plurality of data lines disposed on the active area of the transparent substrate, a plurality of scan lines disposed on the active area of the transparent substrate, wherein the scan lines are perpendicular to the data lines, and a plurality of leads electrically connected to the corresponding scan lines, and the leads parallel to the data lines.

13 Claims, 4 Drawing Sheets

DISPLAY PANEL AND MANUFACTURING METHOD THEREOF

RELATED APPLICATIONS

This application is a National Phase of PCT Patent Application No. PCT/CN2019/087337 having International filing date of May 17, 2019, which claims the benefit of priority of Chinese Patent Application No. 201910093568.5 filed on Jan. 30, 2019. The contents of the above applications are all incorporated by reference as if fully set forth herein in their entirety.

FIELD AND BACKGROUND OF THE INVENTION

The present invention relates to a field of display technologies, and more particularly, to a display panel and a manufacturing method thereof.

With the improvement of liquid crystal display (LCD) panel technology, small-sized panels, especially 4-7 inch mobile phone panels, are gradually developing toward ultra-narrow borders and even no borders. Traditional display panels narrow borders thereof by reducing the footprint of circuits of gate driver on array (GOA), reducing the size of the IC chip for touch and display driver integration (TDDI), and reducing the spacing of traces. At present, the width of the border is now close to 0.7 mm to 0.8 mm. However, in order to ensure the effective operation of the GOA, the reliability of the panels, and the separation of various signal traces, the reducing of width for the borders (especially the lateral borders) is approaching the limitation.

Therefore, it is necessary to provide a display panel and a manufacturing method thereof to solve the problems of the prior art.

SUMMARY OF THE INVENTION

The object of the present invention is to provide a flexible display device and a manufacturing method thereof, which can not only further reduce the width of the lateral border, but also can be compatible with the current process, thereby reducing the refit cost for the equipment or the production cost.

In order to achieve the aforementioned object of the present invention, the present invention provides a display panel, including:

a substrate having a semiconductor film layer structure, wherein the semiconductor film layer structure is provided with a gate driver on array (GOA) region, an active area (AA), and an integrated circuit (IC) region, the gate driver on array region is opposite to the integrated circuit region, and the active area is located between the gate driver on array region and the integrated circuit region, wherein the semiconductor film layer structure comprises: a first metal layer, an interlayer insulation layer, a second metal layer, and a planarization layer, the interlayer insulation layer is disposed between the first metal layer and the second metal layer, the planarization layer is disposed on the second metal layer, and the planarization layer has a plurality of conductive holes;

a plurality of data lines disposed on the active area of the transparent substrate, wherein the data lines are formed by a patterning process for the second metal layer;

a plurality of scan lines disposed on the active area of the transparent substrate, wherein the scan lines are perpendicular to the data lines, and the scan lines are formed by a patterning process for the first metal layer; and a lower transparent conductive layer disposed on the planarization layer, wherein the lower transparent conductive layer is formed into a plurality of leads by a patterning process for the lower transparent conductive layer, the leads are electrically connected to the corresponding scan lines through the conductive holes, and the leads are parallel to the data lines.

In one embodiment of the present invention, at least one of the leads is disposed between two adjacent data lines.

In one embodiment of the present invention, the display further includes an insulation layer and an upper transparent conductive layer, wherein the insulation layer is disposed on the leads, and the upper transparent conductive layer is disposed on the insulation layer and is electrically connected to the data lines.

In one embodiment of the present invention, the lower transparent conductive layer and the upper transparent conductive layer are made of a transparent conductive material.

In one embodiment of the present invention, one of the leads misaligns with one of the data lines.

The present invention further provides a manufacturing method of a display panel, including:

providing a substrate having a semiconductor film layer structure, wherein the semiconductor film layer structure is sequentially layered by a light shielding layer, a buffer layer, a semiconductor layer, and a gate insulation layer;

forming a first metal layer on the gate insulation layer, wherein the first metal layer is formed into a plurality of scan lines by a patterning process;

forming an interlayer insulation layer on the first metal layer;

forming a second metal layer on the interlayer insulation layer, wherein the second metal layer is formed into a plurality of data lines by a patterning process;

forming a planarization layer on the second metal layer and the interlayer insulation layer, wherein the planarization layer has a plurality of conductive holes;

forming a lower transparent conductive layer on the planarization layer, wherein the lower transparent conductive layer is formed into a plurality of leads by a patterning process, wherein the leads are electrically connected to the corresponding scan lines through the conductive holes, and the leads misalign with the data lines;

forming an insulation layer on the lower transparent conductive layer;

and forming an upper transparent conductive layer on the insulation layer, wherein the upper transparent conductive layer is electrically connected to the corresponding data lines through the conductive holes.

In one embodiment of the present invention, at least one on the leads is disposed between two adjacent data lines.

In one embodiment of the present invention, a first conductive hole and a second conductive hole are formed in the planarization layer by a patterning process, wherein the first conductive hole is electrically connected to the lead with the corresponding scan line, the second conductive hole is electrically connected to the upper transparent conductive layer with the corresponding data line.

In one embodiment of the present invention, the semiconductor film layer structure is provided with a gate driver on array region, an active area, and an integrated circuit region, wherein the gate driver on array region is opposite to the integrated circuit region, and the active area is located between the gate driver on array region and the integrated circuit region.

In one embodiment of the present invention, the scan lines and the gate driver on array region are electrically connected by the leads.

The present invention further provides a display panel, including:

a substrate having a semiconductor film layer structure, wherein the semiconductor film layer structure is provided with a gate driver on array region, an active area, and an integrated circuit region, the gate driver on array region is opposite to the integrated circuit region, and the active area is located between the gate driver on array region and the integrated circuit region;

a plurality of data lines disposed on the active area of the transparent substrate;

a plurality of scan lines disposed on the active area of the transparent substrate, wherein the scan lines are perpendicular to the data lines; and a plurality of leads electrically connected the corresponding scan lines with the gate driver on array region, and the leads are parallel to the data lines.

In one embodiment of the present invention, at least one of the leads is disposed between two adjacent data lines.

In one embodiment of the present invention, the display panel further includes an insulation layer and an upper transparent conductive layer, wherein the insulation layer is disposed on the leads, and the upper transparent conductive layer is disposed on the insulation layer and is electrically connected to the data lines.

In one embodiment of the present invention, the leads and the upper transparent conductive layer are made of a transparent conductive material.

In one embodiment of the present invention, one of the leads misaligns with one of the data lines.

The present invention further provides a display panel, including:

a substrate having a semiconductor film layer structure, wherein the semiconductor film layer structure is provided with an active area;

a plurality of data lines disposed on the active area of the transparent substrate;

a plurality of scan lines disposed on the active area of the transparent substrate, wherein the scan lines are perpendicular to the data lines; and a plurality of leads electrically connected to the corresponding scan lines, and the leads are parallel to the data lines.

In one embodiment of the present invention, the semiconductor film layer structure comprises: a first metal layer, an interlayer insulation layer, a second metal layer, and a planarization layer, the interlayer insulation layer is disposed between the first metal layer and the second metal layer, the planarization layer is disposed on the second metal layer, and the planarization layer has a plurality of conductive holes.

In one embodiment of the present invention, the scan lines are formed by a patterning process for the first metal layer, the data lines are formed by a patterning process for the second metal layer, and the leads are electrically connected to the corresponding scan lines through the conductive holes.

In one embodiment of the present invention, the leads are made of a transparent conductive material.

In one embodiment of the present invention, at least one of the leads is disposed between two adjacent data lines, and one of the leads misaligns with one of the data lines.

The beneficial effect: the present invention uses the patterned transparent conductive material as the lead to transmit the signal from the scan line. The transparent conductive leads do not need to be led to the borders, thereby the width of the borders can be further reduced. In addition, the present invention is compatible with the current process, and it does not require additional masks and additional lithography process, which can reduce the refit cost for the equipment or the production cost. Moreover, the leads misalign with the data lines, which can effectively reduce the parasitic capacitance.

BRIEF DESCRIPTION OF THE SEVERAL VIEWS OF THE DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

DESCRIPTION OF SPECIFIC EMBODIMENTS OF THE INVENTION

Figure 1:
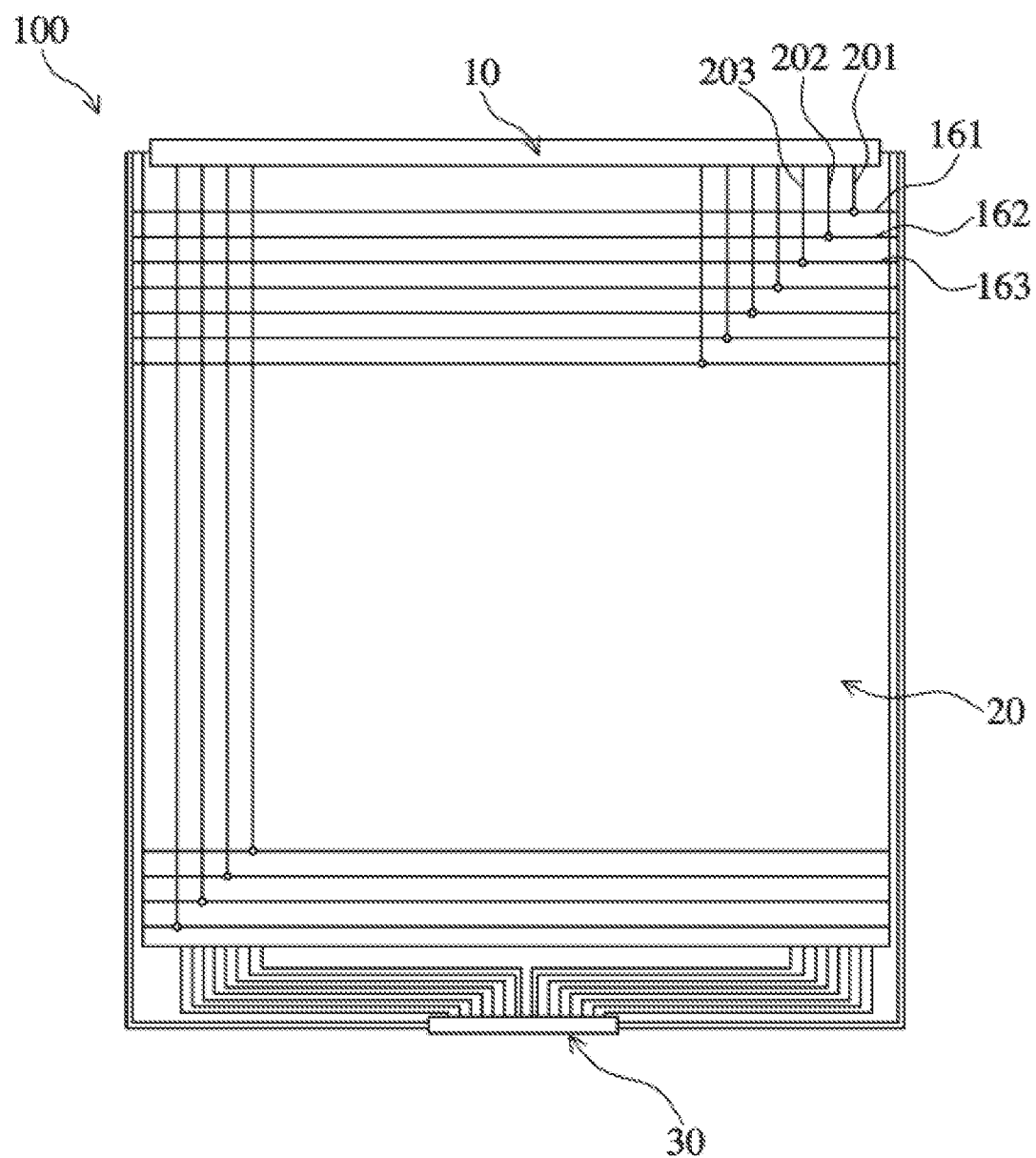
FIG. 1 is a schematic diagram showing the configuration of a display panel according to one embodiment of the present invention.

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting. Throughout this specification and in the drawings like parts will be referred to by the same reference numerals.

Figure 2:
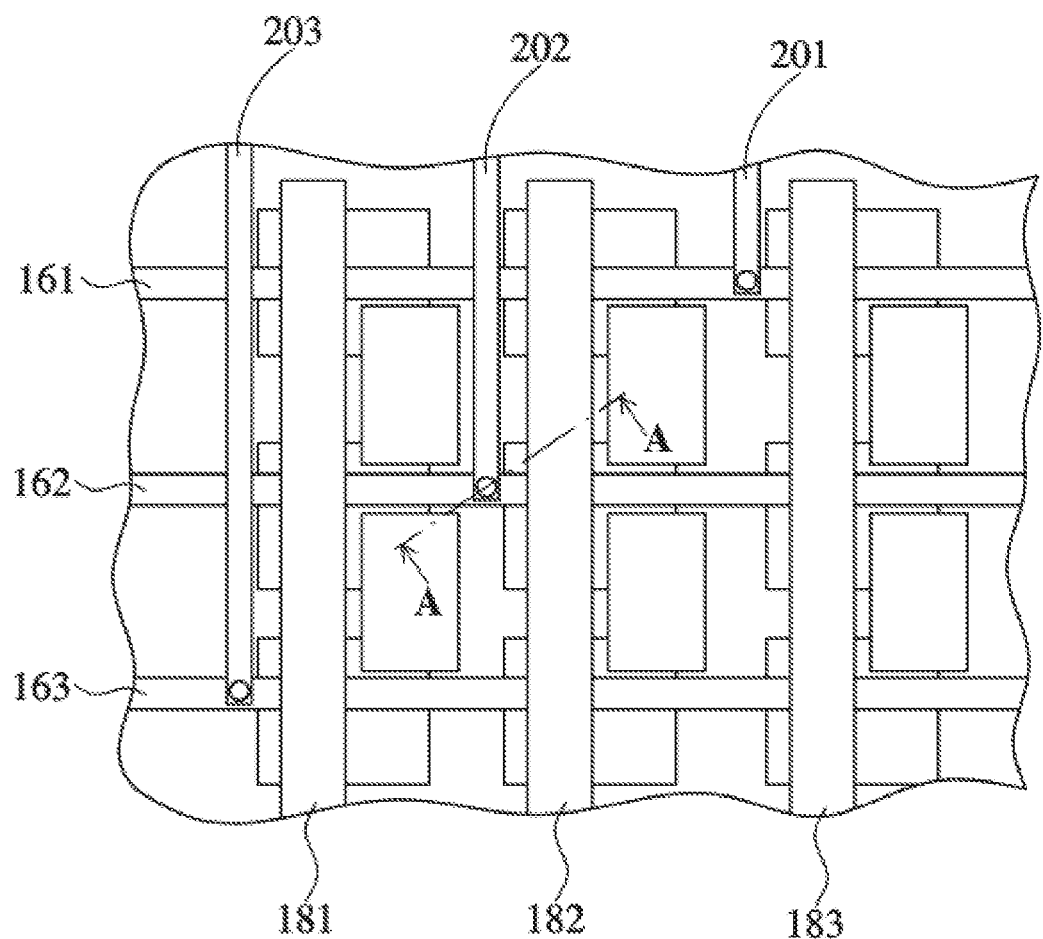
FIG. 2 is a partial enlarged view of the embodiment of FIG. 1.
Figure 3:
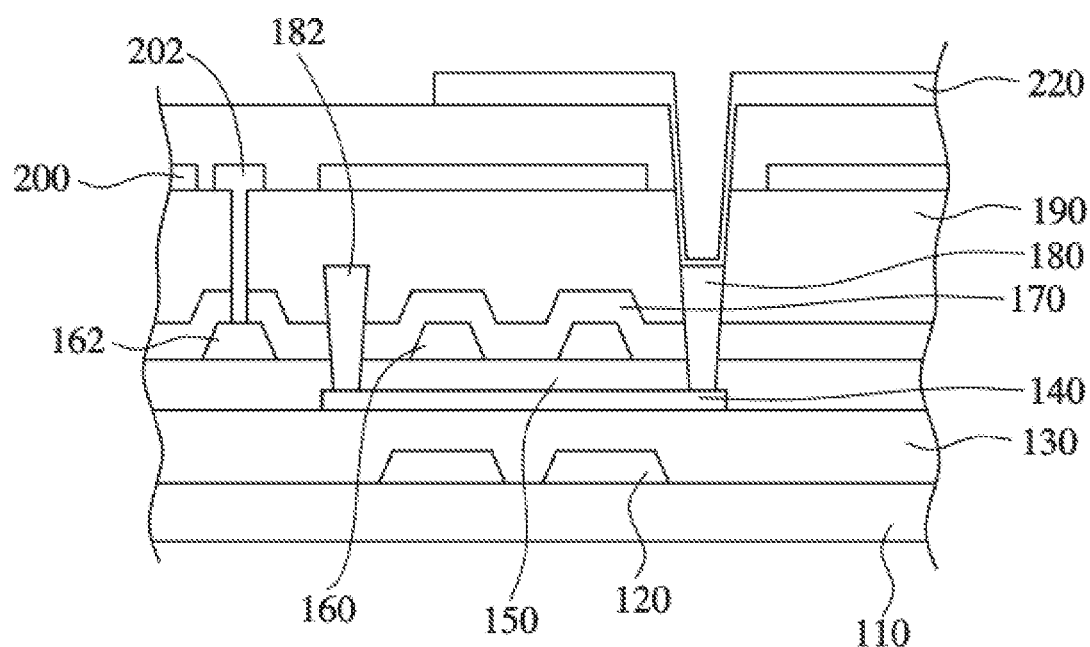
FIG. 3 is a cross-sectional view taken along line A-A of the embodiment in FIG. 2.

Please refer to FIG. 1, FIG. 2, and FIG. 3, FIG. 1 is a schematic diagram showing the configuration of a display panel according to one embodiment of the present invention, FIG. 2 is a partial enlarged view of the embodiment of FIG. 1, FIG. 3 is a cross-sectional view taken along line A-A of the embodiment in FIG. 2. The embodiment provides a display panel, and the display panel includes: a transparent substrate 110, a plurality of scan lines 161, 162, 163, a plurality of data lines 181, 182, 183, and a plurality of leads 201, 202, 203.

The transparent substrate 110 having a semiconductor film layer structure, wherein the semiconductor film layer structure is provided with a gate driver on array (GOA) region 10, an active area (AA) 20, and an integrated circuit (IC) region 30, the gate driver on array region 10 is opposite to the integrated circuit region 30, and the active area 20 is located between the gate driver on array region 10 and the integrated circuit region 30. According to the direction of the embodiment of FIG. 1, the gate driver on array region 10 and the integrated circuit region 30 are opposed to each other and spaced by the active area 20. The transparent substrate 110 may be a glass substrate or a substrate made of other light transmissive materials.

The data lines 181, 182, 183 are disposed on the active area 20 of the transparent substrate 110. The scan lines 161, 162, 163 are disposed on the active area 20 of the transparent substrate 110, wherein the scan lines 161, 162, 163 are perpendicular to the data lines 181, 182, 183. The leads 201, 202, 203 are electrically connected the corresponding scan lines 161, 162,163 with the gate driver on array region 10, and the leads 201, 202, 203 are parallel to the data lines 181, 182, 183. As shown in FIG. 2, the leads 201, 202, 203 are respectively disposed between two adjacent data lines 181, 182, 183. According to the direction of the embodiment of FIG. 1, the scan lines 161, 162, 163 may be led to the gate driver on array region 10 which is opposite to integrated circuit region 30 through the leads 201, 202, 203. It means, the gate driver on array region 10 and the integrated circuit region 30 may respectively be disposed above and below the active area 20, which can reduce the width of the lateral borders (left and right borders) of the display panel 100.

Please refer to FIG. 3, the semiconductor film layer structure on the transparent substrate 110 is sequentially layered by a light shielding layer 120, a buffer layer 130, a semiconductor layer 140, a gate insulation layer 150, a first metal layer 160, an interlayer insulation layer 170, a second metal layer 180, a planarization layer 190, a lower transparent conductive layer 200, an insulation layer 210, and an upper transparent conductive layer 220.

The light shielding layer 120 is disposed on the transparent substrate 110, and the light shielding layer 120 may be made of a metal material such as Mo, Al, Cu, Ti or an alloy thereof. The buffer layer 130 may be disposed on the transparent substrate 110 and the light shielding layer 120 by a deposition technique. The buffer layer 130 may be a single layer film or a multi-layer film containing $SiO_x$ or $SiN_x$. The semiconductor layer 140 may be formed on the buffer layer 130 by a deposition technique. An active region may be defined by a patterning process for the semiconductor layer 140. The material of the semiconductor layer 140 may be polysilicon or other suitable material. The gate insulation layer 150 may be disposed on the semiconductor layer 140 by a deposition technique. The gate insulation layer 150 may be a single layer film or a multi-layer film containing $SiO_x$ or $SiN_x$.

The first metal layer 160 is disposed on the gate insulation layer 150, and the first metal layer 160 is formed into the scan lines 161, 162, 163 by a patterning process. The material of the first metal layer 160 may contain Mo, Al, Cu, or an alloy thereof. The interlayer insulation layer 170 is disposed on the first metal layer 160. The interlayer insulation layer 170 may be a single layer film or a multi-layer film containing $SiO_x$ or $SiN_x$. The second metal layer 180 is disposed on the interlayer insulation layer 170, and the second metal layer 180 is formed into the data lines 181, 182, 183 by a patterning process. The material of the second metal layer 180 may contain Mo, Al, Cu, or an alloy thereof.

The planarization layer 190 is disposed on the second metal layer 180 and the interlayer insulation layer 170, and the planarization layer 190 has a plurality of conductive holes 192, 194.

The lower transparent conductive layer 200 is disposed on the planarization layer 190, wherein the lower transparent conductive layer 200 is formed into the leads 201, 202, 203 by a patterning process. As shown in FIG. 3, the lead 202 is electrically connected to the corresponding scan line 162 through the conductive hole 192, thereby the scan line 162 is led to the gate driver on array region 10 above the active area 20 (as shown in FIG. 1). In addition, the lead 202 misaligns with the data line 182, that mean, the lead 202 does not overlap with the data line 182. The lower transparent conductive layer 200 is made of a transparent conductive material, such as indium tin oxide (ITO) or other transparent conductive material having similar characteristics. Moreover, the use of the transparent conductive material as the plurality of leads 201, 202, 203 does not require an additional deposition step, and also can maintain a higher aperture ratio.

The insulation layer 210 is disposed on the leads 201, 202, 203 of the lower transparent conductive layer 200. The upper transparent conductive layer 220 is disposed on the insulation layer 210, and the upper transparent conductive layer 220 is electrically connected to the data lines 181, 182, 183. As shown in FIG. 3, the upper transparent conductive layer 220 is electrically connected to one of the corresponding data lines through the conductive hole 194. The insulation layer 210 may also include a passivation layer. The upper transparent conductive layer 220 is made of a transparent conductive material, such as indium tin oxide (ITO) or other transparent conductive material having similar characteristics.

The semiconductor film layer structure described herein may be formed by patterning process, such as photolithography technique in conjunction with etching technique, or similar techniques that can be applied in the semiconductor industry. The film layer of the semiconductor film layer structure may be formed by vapor deposition, evaporation, or sputtering techniques.

According to the direction of the embodiment of FIG. 1, the leads 201, 202, 203 are served as the traces connected to the gate driver on array region 10, wherein the leads 201, 202, 203 are formed by a patterning process for the lower transparent conductive layer 200. In addition, the leads 201, 202, 203 are parallel to the data lines 181, 182, 183, therefore the gate driver on array region 10 and the integrated circuit region 30 can respectively be disposed above and below the active area 20. Thus, the width of the lateral borders (left and right borders) of the display panel 100 can be reduced, and the display panel with extremely narrow borders can be realized.

Figure 4:
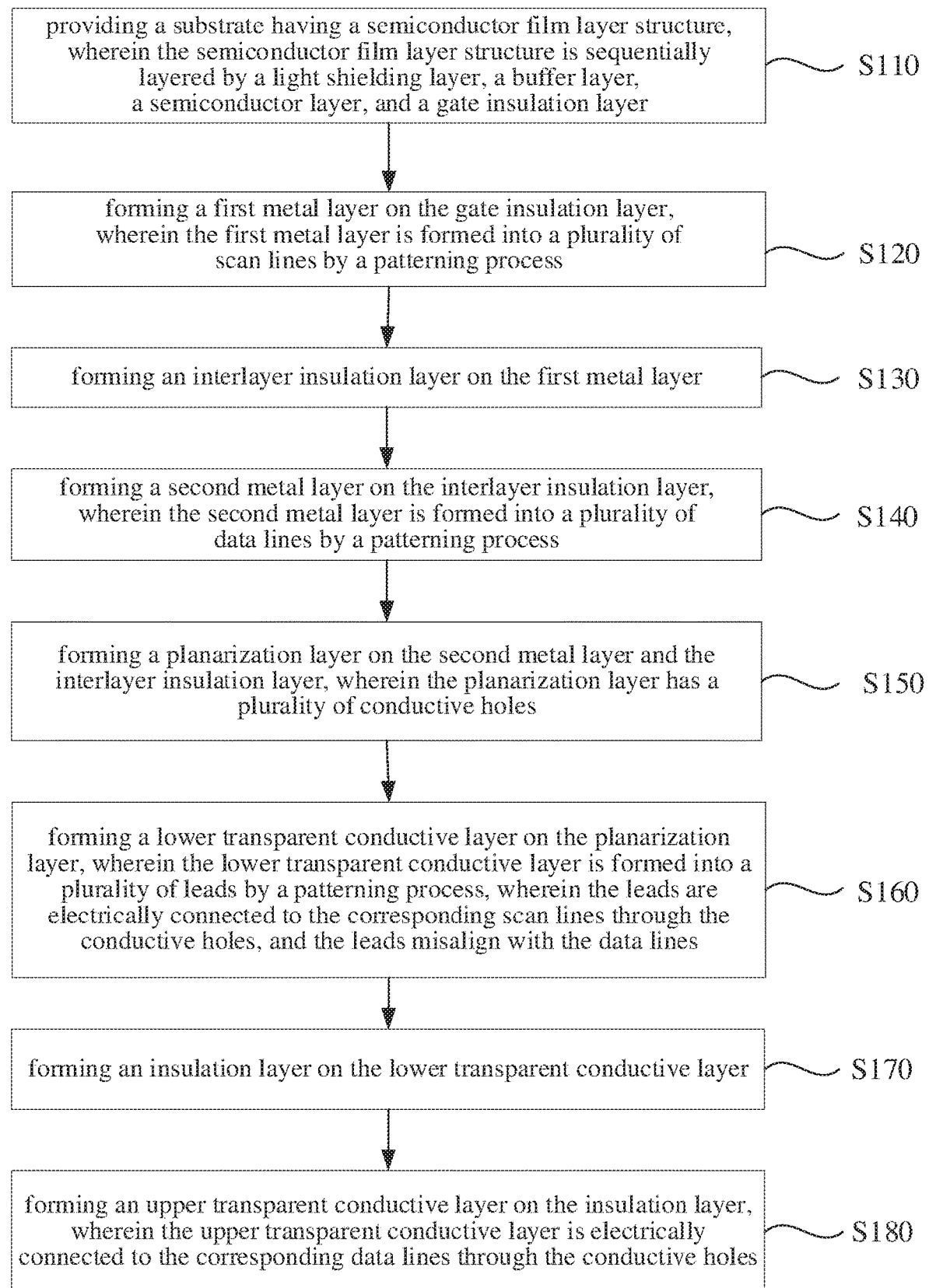
FIG. 4 is a flow chart of a manufacturing method of a display panel according to one embodiment of the present invention.

Please refer to FIG. 4, FIG. 4 is a flow chart of a manufacturing method of a display panel according to one embodiment of the present invention. The embodiment provides a manufacturing method of a display panel, including:

Step S110, providing a substrate having a semiconductor film layer structure, wherein the semiconductor film layer structure is sequentially layered by a light shielding layer, a buffer layer, a semiconductor layer, and a gate insulation layer. In addition, the semiconductor film layer structure is provided with a gate driver on array region, an active area, and an integrated circuit region, wherein the gate driver on array region is opposite to the integrated circuit region, and the active area is located between the gate driver on array region and the integrated circuit region.

Step S120, forming a first metal layer on the gate insulation layer, wherein the first metal layer is formed into a plurality of scan lines by a patterning process.

Step S130, forming an interlayer insulation layer on the first metal layer

Step S140, forming a second metal layer on the interlayer insulation layer, wherein the second metal layer is formed into a plurality of data lines by a patterning process.

Step S150, forming a planarization layer on the second metal layer and the interlayer insulation layer, wherein the planarization layer has a plurality of conductive holes. For example, a first conductive hole and a second conductive hole are formed in the planarization layer by a patterning process, wherein the first conductive hole is electrically connected to the lead with the corresponding scan line, the second conductive hole is electrically connected to the upper transparent conductive layer with the corresponding data line.

Step S160, forming a lower transparent conductive layer on the planarization layer, wherein the lower transparent conductive layer is formed into a plurality of leads by a patterning process, wherein the leads are electrically connected to the corresponding scan lines through the conductive holes, and the leads misalign with the data lines. In addition, at least one on the leads is disposed between two adjacent data lines. Moreover, the scan lines and the gate driver on array region are electrically connected by the leads.

Step S170, forming an insulation layer on the lower transparent conductive layer.

Step S180, forming an upper transparent conductive layer on the insulation layer, wherein the upper transparent conductive layer is electrically connected to the corresponding data lines through the conductive holes. The beneficial effect: the present invention uses the patterned transparent conductive material as the lead to transmit the signal from the scan line. The transparent conductive leads do not need to be led to the borders, thereby the width of the borders can be further reduced. In addition, the present invention is compatible with the current process, and it does not require additional masks and additional lithography process, which can reduce the refit cost for the equipment or the production cost. Moreover, the leads misalign with the data lines, which can effectively reduce the parasitic capacitance.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A display panel, comprising:
   a substrate having a semiconductor film layer structure, wherein the semiconductor film layer structure is provided with a gate driver on array region, an active area, and an integrated circuit region, the gate driver on array region is opposite to the integrated circuit region, and the active area is located between the gate driver on array region and the integrated circuit region, wherein the semiconductor film layer structure comprises: a first metal layer, an interlayer insulation layer, a second metal layer, and a planarization layer, the interlayer insulation layer is disposed between the first metal layer and the second metal layer, the planarization layer is disposed on the second metal layer, and the planarization layer has a plurality of conductive holes;
   a plurality of data lines disposed on the active area of the substrate, wherein the data lines are formed by a patterning process for the second metal layer;
   a plurality of scan lines disposed on the active area of the substrate, wherein the scan lines are perpendicular to the data lines, and the scan lines are formed by a patterning process for the first metal layer; and
   a lower transparent conductive layer disposed on the planarization layer, wherein the lower transparent conductive layer is formed into a plurality of leads by a patterning process for the lower transparent conductive layer, the leads are electrically connected to the corresponding scan lines through the conductive holes, and the leads are parallel to the data lines;
   wherein one of the leads misaligns with one of the data lines.

2. The display panel according to claim 1, wherein at least one of the leads is disposed between two adjacent data lines.

3. The display panel according to claim 1, further comprising an insulation layer and an upper transparent conductive layer, wherein the insulation layer is disposed on the leads, and the upper transparent conductive layer is disposed on the insulation layer and is electrically connected to the data lines.

4. The display panel according to claim 3, wherein the lower transparent conductive layer and the upper transparent conductive layer are made of a transparent conductive material.

5. A display panel, comprising:
   a substrate having a semiconductor film layer structure, wherein the semiconductor film layer structure is provided with a gate driver on array region, an active area, and an integrated circuit region, the gate driver on array region is opposite to the integrated circuit region, and the active area is located between the gate driver on array region and the integrated circuit region, wherein the semiconductor film layer structure comprises: a gate insulation layer, a first metal layer, an interlayer insulation layer, a second metal layer, and a planarization layer;
   a plurality of data lines disposed on the active area of the substrate, wherein the data lines are formed from the second metal layer disposed on the interlayer insulation layer;
   a plurality of scan lines disposed on the active area of the substrate, wherein the scan lines are perpendicular to the data lines, and the scan lines are formed from the first metal layer disposed on the gate insulation layer; and
   a plurality of leads electrically connected the corresponding scan lines with the gate driver on array region, and the leads are parallel to the data lines, wherein the leads are formed from a lower transparent conductive layer disposed on the planarization layer, and one of the leads misaligns with one of the data lines.

6. The display panel according to claim 5, wherein at least one of the leads is disposed between two adjacent data lines.

7. The display panel according to claim 5, further comprising an insulation layer and an upper transparent conductive layer, wherein the insulation layer is disposed on the leads, and the upper transparent conductive layer is disposed on the insulation layer and is electrically connected to the data lines.

8. The display panel according to claim 7, wherein the leads and the upper transparent conductive layer are made of a transparent conductive material.

9. A display panel, comprising:
   a substrate having a semiconductor film layer structure, wherein the semiconductor film layer structure is provided with an active area, wherein the semiconductor film layer structure comprises: a gate insulation layer, a first metal layer, an interlayer insulation layer, a second metal layer, and a planarization layer;

a plurality of data lines disposed on the active area of the substrate, wherein the data lines are formed from the second metal layer disposed on the interlayer insulation layer;

a plurality of scan lines disposed on the active area of the substrate, wherein the scan lines are perpendicular to the data lines, and the scan lines are formed from the first metal layer disposed on the gate insulation layer; and a plurality of leads electrically connected to the corresponding scan lines, and the leads are parallel to the data lines, wherein the leads are formed from a lower transparent conductive layer disposed on the planarization layer, and one of the leads misaligns with one of the data lines.

10. The display panel according to claim 9, wherein the semiconductor film layer structure comprises: a first metal layer, an interlayer insulation layer, a second metal layer, and a planarization layer, the interlayer insulation layer is disposed between the first metal layer and the second metal layer, the planarization layer is disposed on the second metal layer, and the planarization layer has a plurality of conductive holes.

11. The display panel according to claim 10, wherein the scan lines are formed by a patterning process for the first metal layer, the data lines are formed by a patterning process for the second metal layer, and the leads are electrically connected to the corresponding scan lines through the conductive holes.

12. The display panel according to claim 11, wherein the leads are made of a transparent conductive material.

13. The display panel according to claim 11, wherein at least one of the leads is disposed between two adjacent data lines.

* * * * *